United States Patent
Gerstner et al.

(10) Patent No.: US 11,340,280 B2
(45) Date of Patent: May 24, 2022

(54) SYSTEM AND METHOD FOR PERFORMING ELECTROMAGNETIC COMPATIBILITY MEASUREMENTS

(71) Applicant: Rohde & Schwarz GmbH & Co. KG, Munich (DE)

(72) Inventors: Achim Gerstner, Dallas, TX (US); Bill Wangard, Kildeer, IL (US); Lawrence Wilson, Portland, OR (US)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/064,822

(22) Filed: Oct. 7, 2020

(65) Prior Publication Data
US 2022/0107350 A1  Apr. 7, 2022

(51) Int. Cl.
*G01R 31/00* (2006.01)
*H03F 3/21* (2006.01)
*H03F 3/217* (2006.01)

(52) U.S. Cl.
CPC ............ *G01R 31/001* (2013.01); *H03F 3/217* (2013.01)

(58) Field of Classification Search
CPC ...... G01R 31/001; G01R 31/12; G01R 31/28; G01R 29/0814; H03F 3/217
See application file for complete search history.

(56) References Cited

U.S. PATENT DOCUMENTS

| 8,212,572 | B2  | 7/2012 | Webb |
| 2011/0018553 | A1* | 1/2011 | Webb ................... G01R 31/001 324/612 |
| 2013/0043885 | A1  | 2/2013 | Mertel et al. |
| 2021/0018547 | A1* | 1/2021 | Brigance ............. G01R 29/105 |

FOREIGN PATENT DOCUMENTS

| CN | 201383865 Y | 1/2010 |
| WO | 200733646 A2 | 3/2007 |

OTHER PUBLICATIONS

Ametek Compliance Test Solutions, "Test system for immunity to interference," Website Article, Retrieved from https://www.teseq.ch/news/2017/NSG-4070.php, dated Jul. 3, 2017, 4 pages.
Extended European Search Report for European Patent Application No. 21188649.4, dated Feb. 4, 2022, 8 pages.
Jinlong Li et al., "Analysis of interference caused by intermodulation in multi-tone radiated immunity tests", 2018 IEEE International Symposium on Electromagnetic Compatibility and 2018 IEEE Asia-Pacific Symposium on Electromagnetic Compatability (EMC/APEMC), IEEE, May 14, 2018 (May 14, 2018), pp. 660-663, XP033364050.

(Continued)

*Primary Examiner* — Son T Le
(74) *Attorney, Agent, or Firm* — Westman, Champlin & Koehler, P.A.

(57) ABSTRACT

The present invention provides a system and a method for performing electromagnetic compatibility measurements. A signal source generates a test signal which is amplified by an amplifier. Overdriving of the amplifier is prevented by limiting the test signal applied to the amplifier below a predefined threshold value.

16 Claims, 5 Drawing Sheets

(56) References Cited

OTHER PUBLICATIONS

Zihua Zhao et al., "An automatic decision to capture power amplifier nonlinear features in electromagnetic susceptibility tests", Electrical and Control Engineering (ICECE), 2011 International Conference on, IEEE, Sep. 16, 2011 (Sep. 16, 2011), pp. 5742-5745, XP031960652.
Soydan Cakir et al., "New Verification Methods for Low-Frequency Susceptibility Testing", 2020 International Symposium on Electromagnetic Compatibility—EMC Europe, IEEE, Sep. 23, 2020 (Sep. 23, 2020), pp. 1-6, XP033852838.
Domenico Zito et al., "Dual-Input Pseudo-Switch RF Low Noise Amplifier", IEEE Transactions on Circuits and Systems II: Express Briefs, IEEE, USA, vol. 57, No. 9, Sep. 1, 2010 (Sep. 1, 2010), pp. 661-665, XP011317381.

\* cited by examiner

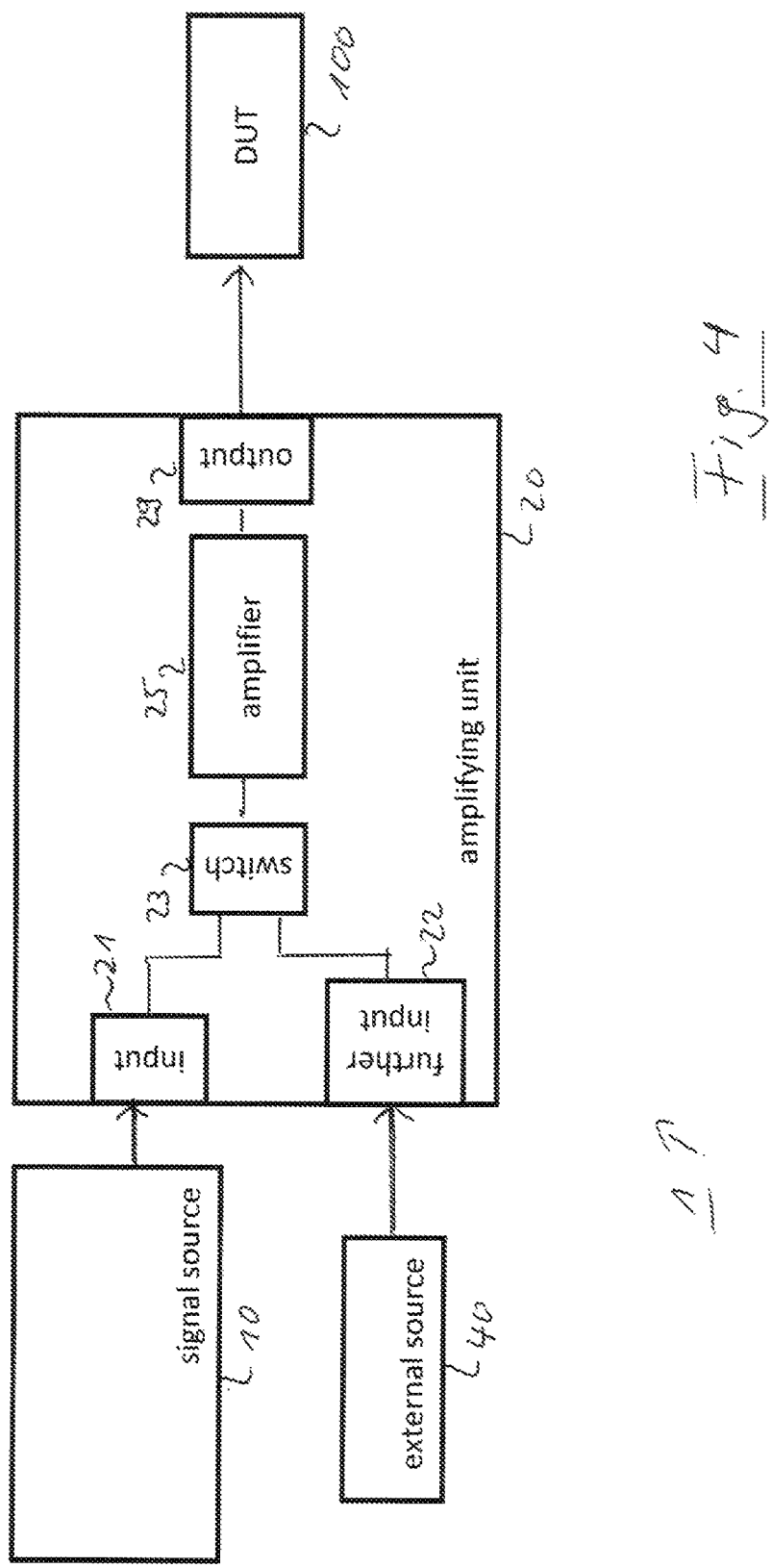

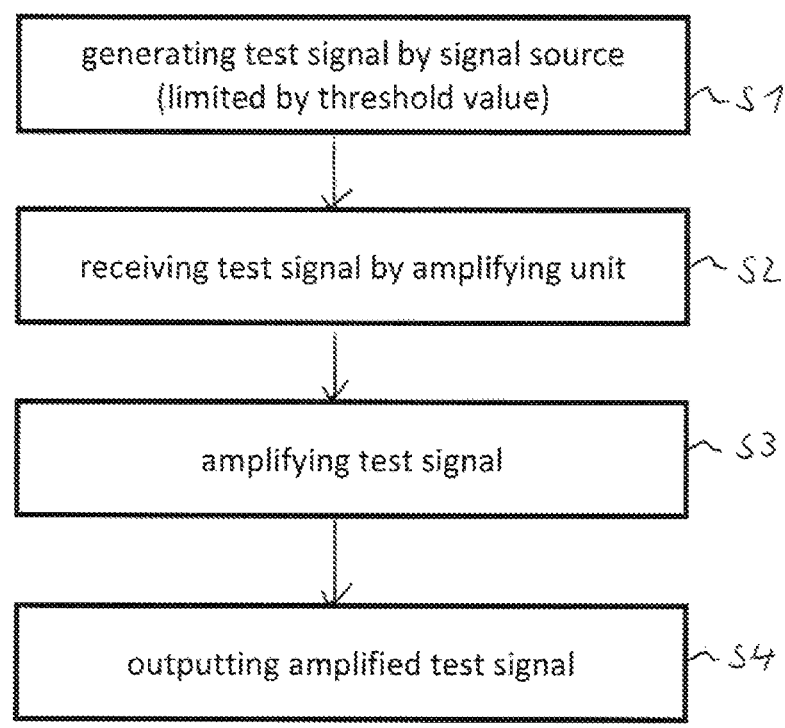

SYSTEM AND METHOD FOR PERFORMING ELECTROMAGNETIC COMPATIBILITY MEASUREMENTS

TECHNICAL FIELD

The present invention relates to a system for performing electromagnetic compatibility measurements. The present invention further relates to a method for performing electromagnetic compatibility measurements.

BACKGROUND

Although applicable in principle to any device for amplifying an electronic signal from a signal source, the present invention and its underlying problem will be hereinafter described in connection with a device providing test signals for performing electromagnetic compatibility (EMC) measurements.

For testing EMC of a device under test or a test arrangement, the respective device or test arrangement may be provided with specific test signals. Thereupon the response of the device under test or test system is analyzed.

In order to apply the device under test with the required signals for EMC testing, a test system has to generate a predetermined signal having an adequate signal strength.

Against this background, there is a need for a test system and test method for applying appropriate signals on a test scenario for EMC measurement.

SUMMARY

The present invention aims to provide a test system and test method for performing EMC measurements. In particular, the present invention aims to provide a system and a method for providing signals for EMC measurements.

This is achieved by the features of the independent claims. Further advantageous embodiments are subject matter of the dependent claims.

According to a first aspect, a system for performing electromagnetic compatibility measurements is provided. The system comprises a signal source and an amplifying unit. The signal source is configured to generate a test signal. The signal source may further provide the generated test signal to the amplifying unit. The amplifying unit comprises an input, an amplifier and an output. The input of the amplifying unit is configured to receive the generated test signal from the signal source. The amplifier is configured to amplify the received test signal. In particular, the amplifier may perform a predetermined amplification of the received test signal. The output device is configured to output the amplified test signal. The signal source is configured to limit a level of the generated test signal which is provided to the input of the amplifying unit. In particular, the signal source limits the level of the generated test signal to be below a predefined threshold value.

According to a further aspect, a method for performing electromagnetic compatibility measurements is provided. The method comprises a step of generating a test signal. In particular, the test signal may be generated by a signal source. The method further comprises receiving the generated test signal by an input of an amplifying unit, amplifying the received test signal by an amplifier of the amplifying unit and outputting the amplified test signal by an output of the amplifying unit. In particular, a level of the generated test signal which is provided to the input of the amplifying unit is limited to be below a predefined threshold value.

The present invention is based on the finding that testing electromagnetic compatibility (EMC) requires providing test signals with an appropriate signal level. For this purpose, the test signals have to be amplified by one or more amplifiers. However, if an amplifier is provided with an input signal having a high signal level, the amplifier may be overdriven. In such a case, the amplifier may no longer provide a linear amplification of the input signal. Furthermore, it may be even possible that the amplifier may be damaged if an input level of a signal is too high.

The present invention takes into account this finding and aims to limit a maximum signal level of an input signal provided to an amplifier of an EMC test system. In this way, it is possible to prevent the amplifier from being overdriven.

For this purpose, a predefined threshold value may be set according to the properties of the amplifier. Especially, the predefined threshold value may be set such that the signal level provided by the signal generator to the input of the amplifier is always below a value which would cause the amplifier to be overdriven. By defining the threshold value according to the properties of the amplifier, it is possible to configure the whole system of signal source and amplifier in an appropriate manner. In particular, by using a threshold value for limiting the signal level of the signal provided by the signal generator according to the properties of the amplifier, it is possible to adapt the individual components, in particular the signal source and the amplifier such that the test signal provided by the signal generator is amplified in an optimal manner without overdriving the amplifier. In this way, non-linearities in the amplification by the amplifier can be avoided and the amplifier can be protected from damage.

The signal source may be any kind of appropriate signal source for generating appropriate test signals. For this purpose, the signal source may comprise elements such as an analog or digital signal generator. For example, the signal source may comprise a digital signal processor for digitally generating a specific signal waveform. However, any other manner for generating a desired test signal may be possible, too.

The signal source may generate one or more test signals having predetermined properties. For example, it may be possible to specify one or more frequencies or frequency ranges which may be covered by the generated test signal. Furthermore, it may be also possible to specify a signal shape of the signal generated by the signal generator. For instance, the signal generator may generate a sinusoidal signal, a signal with a rectangular or sawtooth shape or any other desired signal shape. Furthermore, the test signal generated by the signal generator may comprise a test signal with a predetermined pulse sequence or the like. However, it is understood, that any other specific properties for characterizing the test signal generated by the signal generator may be also possible.

Depending on a configuration of the signal generator or a specific type of signal generator, an output level and/or a maximum amplitude of the test signal provided by the signal generator may vary. Thus, as will be described in more detail below, it might be necessary to adapt, especially limit, the test signal provided by the signal generator according to the properties of the subsequent amplifier for amplifying the test signal.

The amplifier may be any kind of appropriate amplifier for amplifying the test signal provided by the signal generator. For this purpose, the amplifying unit with the amplifier may comprise an input port which is electrically coupled with an output of the signal generator. Accordingly, the test signal provided by the signal generator is received by the input port of the amplifying unit. Further, the amplifying unit may comprise an output port for providing the amplified test signal.

The amplifier of the amplifying unit amplifies the signal received at the input port of the amplifying unit and outputs the amplified signal to the output port. For this purpose, the amplifier may be any appropriate amplifier for amplifying the electrical signal. Especially, the amplifier may have an appropriate frequency range and/or bandwidth according to the frequency properties of the test signal provided by the signal generator. Furthermore, the amplifier may perform an appropriate amplification in order to provide an output signal with appropriate properties for performing the desired EMC measurements. For example, the amplifier may provide the amplified test signal with a specific signal level and/or amplitude. However, the amplifier may also have any other appropriate characteristics according to the desired requirements for performing the EMC measurement.

For example, the amplifier may be an operational amplifier or the like. However, any other kind of appropriate amplifier may be possible, too. If necessary, the amplifier may comprise multiple amplification elements which may be combined together, for example in an amplification chain in order to achieve the desired amplification properties.

An amplifier usually may operate within predetermined specifications. These specifications may relate, for example, to a specific frequency range or bandwidth. Furthermore, the specifications may also characterize a maximum input level of a signal which may be provided to the amplifier. If the level of the input signal exceeds a maximum input level, the amplifier may be overdriven. In such a case, the amplifier may be not able to perform a linear amplification of the input signal. Furthermore, it may be even possible that the amplifier or at least some components of the amplifier may be damaged if the level of the input signal exceeds a maximum signal level.

In order to avoid such a case when the amplifier is provided with an input signal higher than a specific signal level, the input signal provided to the amplifier may be controlled such that the input signal is always below a predefined threshold value, for example a maximum input level of the amplifier. In this way, it may be possible to prevent the amplifier from to be overdriven.

For this purpose, any kind of appropriate scheme for limiting the input signal provided to the amplifier may be possible. For example, it may be possible to provide the signal generator with the predefined threshold value and control the operation of the signal generator such that the generated test signal is always below the predefined threshold value. Alternatively, it may be also possible to use a standardized signal generator and operate this signal generator in a conventional manner Subsequently, an attenuation element may be arranged between an output of the signal generator and the input of the amplifier in order to limit the test signal provided to the input of the amplifier. However, any other manner for limiting the signal level or the maximum amplitude of the test signal to be always below the predefined threshold value may be possible, too.

By limiting the input of the amplifier, in particular the signal level and/or the maximum amplitude of the signal provided to the amplifier to a predefined maximum value, it is possible to avoid overdriving the amplifier. Accordingly, non-linearities in the amplification of the amplifier or damage of the amplifier can be prevented.

Further embodiments of the present invention are subject of the further subclaims and of the following description referring to the drawings.

In a possible embodiment, the maximum signal level of the signal source is set based on the predefined threshold value.

For example, the predefined threshold value may be provided to the signal source and the signal source is operated such that the generated test signal always is below the provided predefined threshold level. For example, the signal source may comprise a digital signal generator which is operated such that the generated test signal is always below the provided predefined threshold level. For this purpose, the predefined threshold level may be provided to the signal source in any appropriate manner. For example, the predefined threshold value may be provided to an appropriate input of the signal source. For instance, digital data may be provided to the signal source for specifying the predefined threshold level. It may be also possible that the signal source comprises an internal memory and the predefined maximum threshold level may be written into this memory, and subsequently, the signal source may refer to this memory for limiting the output signal of the signal source. However, any other manner for limiting the signal provided by the signal source based on the predefined threshold level may be possible, too.

In a possible embodiment, the predefined threshold level is set according to a maximum input level of the amplifier.

For example, the threshold level may be specified based on data provided by a data sheet of the related amplifier. However, it may be also possible to perform some measurements of the amplifier in advance and use these measurement data in order to determine a maximum appropriate input level of the amplifier. Accordingly, by limiting the signal level of the signal provided to the amplifier to a maximum input level of the amplifier, an overdriving of the amplifier can be prevented.

In a possible embodiment, the predefined threshold level is set based on one or more calibration values. The calibration values may be determined in advance before the signal source starts generating the test signal.

Accordingly, the limitation of the test signal provided to the amplifier is limited in an open loop manner. In other words, the limitation of the test signal provided to the amplifier is set without feedback from the amplifier to the signal generator. Moreover, the predefined threshold value is specified once in advance and subsequently, the system with the signal generator and the amplifier is operated based on the predefined threshold level. For example, the signal source may be configured with appropriate settings in order to limit the signal level of the generated signal to be always below the predefined threshold value. Further, it may be possible to adapt the input or target values of the signal source based on the predefined threshold value or to control or configured the signal source in any other appropriate manner such that the generated test signal which is provided to the input of the amplifier is below the predefined threshold value.

In a possible embodiment, the system comprises a controller. The controller may be configured to monitor the generated test signal. For example, the controller may analyze the test signal at the signal source. Alternatively, the controller may analyze the test signal at the amplifying unit, for example at the input of the amplifying unit. The controller may control the signal source in order to limit the level of the generated test signal. In particular, the controller may limit the generation of the test signal by the signal source such that the generated test signal is continuously below the predefined threshold value. In this way, a closed control loop is realized for controlling the generation of the test signal. For example, the controller may directly control the generation by a signal generator of the signal source, for example a digital signal generator. Additionally or alternatively, the controller may control an attenuation device which may attenuate the test signal provided by the signal source before providing the signal to the amplifying unit.

Furthermore, the controller may also monitor the operation of the amplifying unit, in particular the amplifier. For example, the controller may be configured to detect an overdriving of the amplifier and adapt the predefined threshold value if the amplifier is overdriven.

In a possible embodiment, the system comprises a memory. The memory may be configured to store calibration data. The calibration data may comprise data for specifying when an output of the signal source causes overdriving the amplifier. For example, the calibration data may specify a relationship between target values and/or configuration data of the signal source and a corresponding output provided by the signal source. Accordingly, the signal source may be operated based on the calibration data stored in the memory.

Further, the calibration data may be determined based on a data sheet of the amplifier. It may be also possible to analyze the amplifier by measurements and to determine the calibration data based on measurement data which are obtained in advance. For example, the amplifier may be analyzed in a laboratory or the like in order to determine the characteristics of the amplifier. Accordingly, the calibration data may be generated based on the measurements and stored in an appropriate memory.

In a possible embodiment, the memory for storing the calibration data may be included in the signal source, the amplifier or a third-party device. In particular, the memory for storing the calibration data may be communicatively coupled with the controller for controlling the predefined threshold value. The third-party device may be any kind of device which may be communicatively coupled with the signal source and/or the amplifier, in particular with the controller. In particular, at least the signal source, the amplifying unit and the memory may be combined together in a common arrangement, for example in a common housing.

In a possible embodiment, the signal source is configured to be removed from an arrangement comprising at least the signal source and the amplifier. Furthermore, the calibration data may be determined based on measurements when the signal source is removed from the arrangement. For example, it may be possible to measure the signal generation of the signal source after removing the signal source from the common arrangement in order to determine appropriate properties such as a maximum signal level provided by the signal source or the like. Especially, it may be possible to determine relationships between settings of the signal source and a resulting output provided by the signal source and/or a relationship between target values provided to the signal source and the output provided by the signals source, in particular a level or maximum amplitude of the resulting output of the signal source. Furthermore, it may be also possible to analyze the behavior of the arrangement with the amplifier after removing the signal source. For example, appropriate signals may be applied to the arrangement for measuring characteristics of the amplifier and to determine appropriate calibration data based on the analysis of the amplifier when the signal source is removed.

In a possible embodiment, the amplifying unit comprises at least one further input for receiving an external signal. Accordingly, the amplifier of the amplifying unit may be configured to amplify either the received external signal or the received test signal.

In a possible embodiment, the amplifying unit may comprise a switch for providing either the received test signal from the signal source to the amplifier or bypassing the received test signal and providing the external test signal to the amplifier. In this way, the system may be provided with a further test signal from an external signal source for performing EMC measurements. In particular, it may be possible that the further input for receiving the external signal may comprise a component for adapting a signal level or maximum amplitude of the external signal level before providing the external signal to the amplifier. For example, an attenuator or the like may be provided for controlling the signal level or amplitude of the external signal provided to the amplifier. Accordingly, it may be also possible to limit the properties of the externally provided signal to be below the predetermined threshold value.

With the present invention it is therefore possible to provide signals for performing EMC measurements, wherein a test signal is amplified by an amplifier without overdriving the amplifier. It is for this purpose that an input of the amplifier is controlled such that the signal level of the input signal for the amplifier is always below a predefined threshold level.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures and the drawings, in which:

FIG. 4: shows a block diagram of another embodiment for performing EMC measurements; and FIG. 5: shows a flow diagram illustrating a method for performing EMC measurements.

Figure 1:
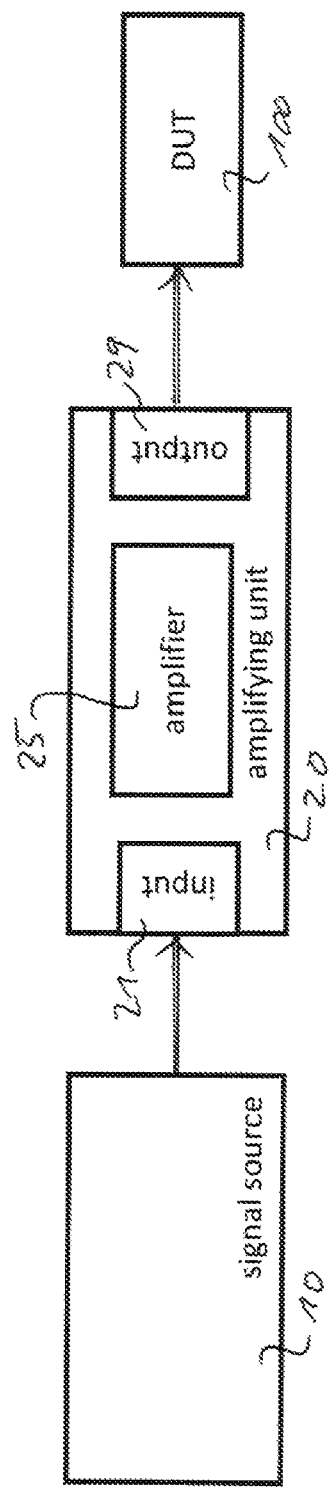
FIG. 1: shows a block diagram of a system for performing EMC measurements according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DESCRIPTION OF EMBODIMENTS

FIG. 1 shows a schematic block diagram of a system 1 for performing electromagnetic compatibility measurements according to an embodiment. The system comprises a signal source 10 and an amplifying unit 20. The signal source 10 generates a test signal which is provided to the amplifier 20. The test signal from the signal source 10 is received by an input port 21 of the amplifying unit 20 and provided to an amplifier 25. Amplifier 25 performs an amplification of the received test signal and provides the amplified test signal to an output port 29 of the amplifying unit 20. In order to perform EMC measurements, the amplified test signal provided at output port 29 may be applied to a device under test 100 or a test arrangement. Accordingly, the EMC of the device under test 100 or the test arrangement may be tested.

Signal source 10 and/or amplifying unit 20 may be, for example, conventional standard components. Accordingly, signal source 10 may provide test signals with specific predetermined properties, in particular with a specific signal level and/or amplitude Amplifier 25 of the amplifying unit 20 may perform a specific amplification of the received test signal. In particular, amplifier 25 may have specific limits, such as a specific maximum input level. If a signal is provided to the amplifier 25 which exceeds this maximum input level, the amplifier 25 may be overdriven. In such a case, the amplifier 25 may no longer perform a linear amplification, and it may be even possible that the amplifier 25 or at least some components of the amplifier 25 may be damaged.

If the properties of the signal source 10 do not match to the properties of amplifier 25 of amplifying unit 20, it may be possible that signal source 10 may provide a test signal which at least partially exceeds the limits of amplifier 25. In order to avoid overdriving amplifier 25, the signal provided to amplifying unit 20 is controlled such that the signal level is always below a predefined threshold value. In this way, overdriving of amplifier 25 can be prevented.

Signal source 10 may be any kind of appropriate signal source for providing the desired test signals. As already mentioned above, signal source 10 may be a conventional signal source or at least comprise a conventional signal generator having specific predetermined properties. For example, signal source 10 may generate one or more signals having specific properties, for example signals with one or more specific frequencies or frequency ranges, specific signal shape, e.g. a sinusoidal signal, a rectangular or sawtooth signal shape, specific pulse sequences or the like. For example, the signal provided by signal source 10 may be generated by a digital signal generator such as a programmable digital signal processor or the like. However, any other kind of signal generator may be possible, too.

Especially, if a conventional signal source which is available in the market may be used, the signal properties such as signal level, maximum amplitude or the like may be within fixed limits.

Furthermore, amplifier 25 of amplifying unit 20 may be an amplifier for amplifying the test signal provided from signal source 10 at input port 21. For example, amplifier 25 may be conventional amplifier, for example an amplifier which is available in the market Amplifier 25 may have specific properties such as bandwidth, frequency range, amplification factor or the like. Even though only a single amplifier 25 is mentioned in this and the following embodiments, it may be also possible to use a combination of multiple amplifiers in order to achieve a desired amplification. For example, a chain two or more subsequent amplifying elements may be possible.

Usually, an amplifier such as amplifier 25 may perform a linear or almost linear amplification of an input signal. However, if the input signal exceeds a specific level, the amplifier 25 may be overdriven. In such a case, the amplifier 25 may be no longer in a position to perform a linear amplification of the input signal. Moreover, in case that the input signal is too high, it may be even possible that the amplifier 25 or at least a component of the amplifier 25 may be damaged.

In case that signal source 10 provides a test signal which may have a signal level or maximum amplitude which is higher than a maximum allowable signal level or amplitude of the amplifier 25, the amplifier 25 may be overdriven. In order to avoid such a situation, the test system 1 of this embodiment may limit the maximum signal level or maximum amplitude of the test signal received by the amplifying unit 20 to a maximum predefined threshold value. Especially, this maximum predefined threshold value may be equal or less than the maximum value which is possible without overdriving amplifier 25.

For example, the maximum predefined threshold value may be used for configuring the signal generation of signal source 10. Additionally or alternatively, it may be also possible to use an attenuator or the like for attenuating or limiting the signal generated by signal source 10 before providing the signal to amplifying unit 20. However, any other manner for limiting the input signal of amplifier 25 to the predefined threshold value may be possible, too.

Figure 2:
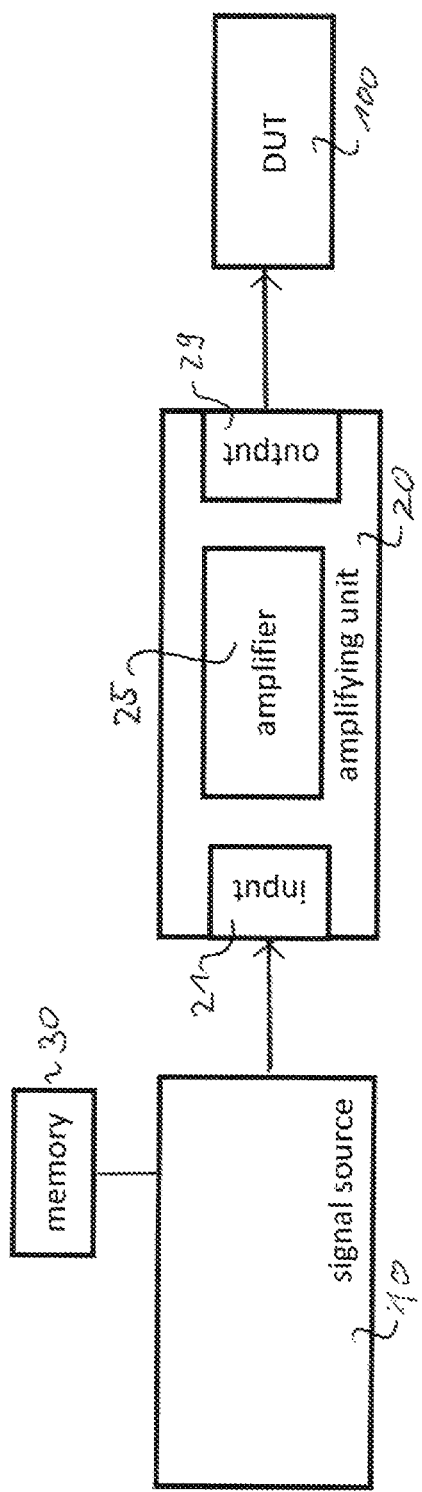
FIG. 2: shows a block diagram of a further system for performing EMC measurements.

FIG. 2 shows a schematic block diagram of a further embodiment for performing EMC measurements. The test system 1 according to FIG. 2 mainly corresponds to the previously described embodiment.

The embodiment according to FIG. 2 limits the input signal of amplifier 25 by an open loop configuration. In other words, there is no feedback from the amplifying unit 20 to signal source 10. Moreover, the arrangement is configured or calibrated only once in advance. For this purpose, it may be possible to measure or analyze signal source 10 and/or amplifier 25 in order to determine the respective properties. For example, it may be possible to remove signal source 10 and/or amplifier 25 from the common test arrangement 1 and measure the respective components individually. For example, the output properties of signal source 10 may be analyzed. Subsequently, the signal source 10 may be configured such that the generated test signal provided by signal source 10 is still below the predefined threshold value. Accordingly, overdriving of amplifier 25 can be avoided. Furthermore, it may be also possible to analyze amplifier 25 in order to determine the properties of amplifier 25, in particular in order to identify a maximum limit of a signal which may be provided to input of amplifier 25 without overdriving amplifier 25.

After measuring signal source 10 and/or amplifier 25, an appropriate configuration may be determined and parameters for operating the system, in particular for operating signal source 10 may be determined. The determined parameters, for example calibration data, may be stored in a memory 30. Memory 30 may be, for example, a memory included in signal source 10. However, it may be also possible that the calibration data may be stored in a memory included in amplifying unit 20 and the respective data are provided via a communication link to signal source 10. Furthermore, any other third-party device with memory 30 for storing the respective data may be possible, too.

Figure 3:
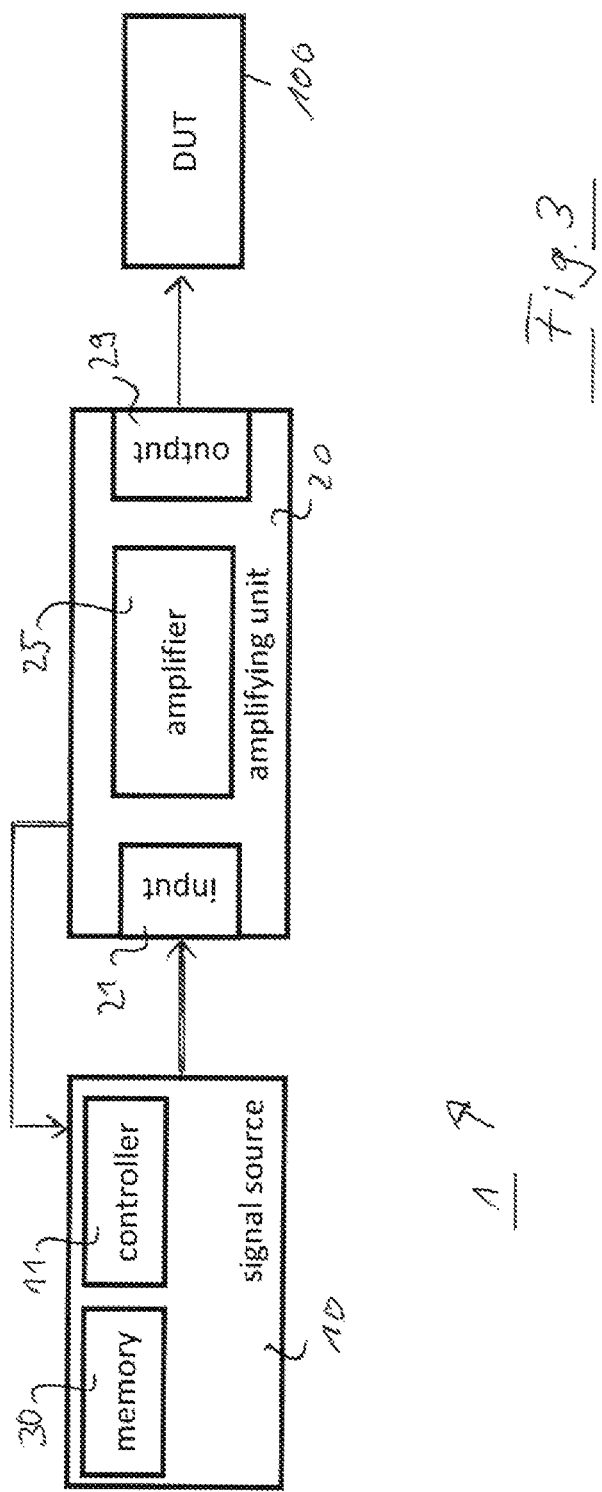
FIG. 3: shows a block diagram of a still further embodiment for performing EMC measurements.

FIG. 3 shows a schematic block diagram of a further system for performing EMC measurements. The arrangement mainly corresponds to the previously described embodiments, in particular to the embodiment of FIG. 1. The configuration according to FIG. 3 differs from the previously described embodiments in that the limitation of the test signal comprises a closed control loop.

For this purpose, a feedback from amplifying unit 20 to signal source 10 is provided. For example, amplifying unit 20 may measure the input signal of amplifier 25. The measured signal or at least data of the maximum amplitude and/or signal level may be provided to signal source 10. Accordingly, signal source 10 may control the signal generation such that the signal at the input of amplifier 25 is always below the predefined threshold value. For this purpose, the signal generation of signal source 10 may be controlled, for example by a controller 11 or the like. Furthermore, additional calibration data may be used for controlling the operation of signal source 10.

As already mentioned above in connection with the embodiment according to FIG. 2, the properties of signal source 10 and/or amplifier 25 may be measured in advance and appropriate calibration data may be determined. The calibration data may comprise, for example data regarding a maximum signal level or amplitude which may be provided to the input of amplifier 25 without overdriving amplifier 25. Furthermore, the calibration data may also comprise data with respect to signal source 10, in particular a signal generator of signal source 10. For example, the calibration data may comprise a table with operational data or configuration parameter for specifying the properties of signal source 10. The respective calibration data may be stored in a memory 30 similar to the memory 30 which has been already described above in connection with the embodiment of FIG. 2.

FIG. 4 shows a schematic block diagram of a further embodiment of a system 1 for performing EMC measurements. The system according to FIG. 4 also may comprise all features of the embodiments which have been already described above in connection with FIGS. 1 to 3.

The embodiment according to FIG. 4 differs from the previously described embodiments in that amplifying unit 20 comprises at least one further input port 22. Each of the at least one further input ports 22 may receive a test signal from an external signal source 40. In this way, an external signal source 40 may be used for generating alternative test signals which may be amplified and applied to a device under test 100 for performing EMC measurements. For this purpose, any kind of appropriate external signal source 40 may be possible. Accordingly, amplifier 25 may alternatively use the test signal provided by the internal signal source 10 or the signal provided by an external signal source 40.

In order to select either the internal test signal provided by internal signal source 10 or an external test signal, a switch 23 may be provided. Switch 23 may be a manually operated switch. However, it may be also possible to use an electronically controlled switch. For example, switch 23 may automatically switch between the internal signal source 10 and an external signal source 40. For example, switch 23 may select the internal signal source 10 if no external signal source 40 is connected to a further input port 22. Alternatively, if an external signal source 40 is connected to the further input port 22, switch 23 may automatically select the external signal source 40.

For example, amplifying unit 20 may comprise an additional element, for example an attenuator or the like which may limit the maximum signal level or amplitude of the external signal to the predefined threshold value. In this way, it is even possible to prevent overdriving amplifier 25 in case that an external test signal is provided.

FIG. 5 shows a schematic diagram illustrating a method for performing EMC measurements according to an embodiment.

In step S1, a test signal is generated. The test signal may be generated by a signal source 10.

In step S2, the generated test signal is received. For example, the test signal may be received by an input 21 of an amplifying unit 20.

In step S3, the received test signal is amplified. For example, the test signal may be amplified by an amplifier 25 of the amplifying unit 20.

In step S4, the amplified test signal is output. For example, the amplified test signal may be output by an output 29 of the amplifying unit 20.

In particular, a level of the generated test signal which is provided to the input of the amplifying unit is limited to be below a predefined threshold value.

The maximum signal level of the signal source may be based on the predefined threshold value.

The predefined threshold value may be set according to a maximum input level of the amplifier.

The predefined threshold value may be set based on one or more calibration values which have been determined in advance before the signal source starts generating the test signal.

The test signal applied to the amplifier may be monitored and the generation of the test signal may be controlled based on the monitored test signal. In particular, the generation of the test signal may be controlled such that the level of the generated test signal is continuously below the predefined threshold value.

Calibration data may be stored in a memory, wherein the calibration data may comprise data specifying when an output of the signal source causes the amplifier to be overdriven. The memory may be included in the signal source, the amplifier or a third-party device.

The signal source may be removed from an arrangement comprising at least the signal source and the amplifier, and calibration data may be determined based on measurements when the signal source is removed from the arrangement.

The method may further comprise a step for receiving an external signal. In particular, the external signal may be received by at least one further input of the amplifying unit. Accordingly, the amplification may perform either an amplification of the external signal or the generated test signal.

In particular, either the external signal or the generated test signal may be selected by a switch for providing either the external signal or the generated test signal to the amplifier.

Summarizing, the present invention provides a system and a method for performing electromagnetic compatibility measurements. A signal source generates a test signal which is amplified by an amplifier. Overdriving of the amplifier is prevented by limiting the test signal applied to the amplifier below a predefined threshold value.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

1 EMC measurement system
10 signal source
11 controller
20 amplifying unit
21 input port
22 further input port
23 switch
25 amplifier
29 output port
30 memory
40 external signal source
100 device under test

The invention claimed is:

1. A system for performing electromagnetic compatibility measurements, the system comprising:
a signal source for generating a test signal;
an amplifying unit with an input for receiving the generated test signal from the signal source, an amplifier for amplifying the received test signal and an output for outputting the amplified test signal;
wherein the signal source is configured to limit a level of the generated test signal which is provided to the input of the amplifying unit to be below a predefined threshold value,
wherein the predefined threshold level is set based on calibration data comprising one or more calibration values,
wherein the signal source is configured to be removed from an arrangement comprising at least the signal source and the amplifier, and
wherein the calibration values are determined based on measurements performed when the signal source is removed from the arrangement.

2. The system of claim 1, wherein a maximum signal level of the test signal generated by the signal source is set based on the predefined threshold value.

3. The system of claim 1, wherein the predefined threshold level is set according to a maximum input level of the amplifier.

4. The system of claim 1, comprising a memory for storing the calibration data.

5. The system of claim 4, wherein the memory is included in the signal source, the amplifier or a third-party device.

6. The system of claim 1, comprising a controller for monitoring the generated test signal and controlling the signal source for limiting the level of the generated test signal to be continuously below the predefined threshold value.

7. The system of claim 1, wherein the amplifying unit comprises at least one further input for receiving an external signal, and
wherein the amplifier is configured to amplify either the external signal or the received test signal.

8. The system of claim 7, wherein the amplifying unit comprises a switch for providing either the received test signal from the signal source to the amplifier or providing the external test signal to the amplifier.

9. A method for performing electromagnetic compatibility measurements, the method comprising:
generating a test signal by a signal source;
receiving the generated test signal by an input of an amplifying unit;
amplifying the received test signal by an amplifier of the amplifying unit; and
outputting the amplified test signal by an output of the amplifying unit,
wherein a level of the generated test signal which is provided to the input of the amplifying unit is limited to be below a predefined threshold value,
wherein the predefined threshold level is set based on calibration data comprising one or more calibration values, and
wherein the calibration values are determined based on measurements when the signal source is removed from an arrangement comprising at least the signal source and the amplifier the arrangement.

10. The method of claim 9, wherein a maximum signal level of the generated test signal is set based on the predefined threshold value.

11. The method of claim 9, wherein the predefined threshold level is set according to a maximum input level of the amplifier.

12. The method of claim 9, comprising storing the calibration data in a memory.

13. The method of claim 12, wherein the memory is included in the signal source, the amplifier or a third-party device.

14. The method of claim 9, comprising monitoring the generated test signal and controlling the signal source for limiting the level of the generated test signal to be continuously below the predefined threshold value.

15. The method of claim 9, comprising receiving an external signal by at least one further input, and
amplifying either the external signal or the received test signal.

16. The method of claim 15, comprising switching a switch for providing either the received test signal from the signal source to the amplifier or providing the external test signal to the amplifier.

* * * * *